(12) United States Patent
Kim et al.

(10) Patent No.: US 11,314,356 B2
(45) Date of Patent: Apr. 26, 2022

(54) TOUCH SENSOR AND DISPLAY DEVICE INCLUDING THE SAME

(71) Applicant: SAMSUNG DISPLAY CO., LTD., Yongin-si (KR)

(72) Inventors: Il Nam Kim, Yongin-si (KR); Byeong Hee Won, Yongin-si (KR); Kyung Tea Park, Yongin-si (KR); Won Sang Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/149,259

(22) Filed: Jan. 14, 2021

(65) Prior Publication Data

US 2021/0132768 A1 May 6, 2021

Related U.S. Application Data

(62) Division of application No. 15/870,523, filed on Jan. 12, 2018, now Pat. No. 10,908,744.

(30) Foreign Application Priority Data

Jul. 14, 2017 (KR) .................. 10-2017-0089804

(51) Int. Cl.
*G06F 3/041* (2006.01)
*G06F 3/044* (2006.01)
*H01L 27/32* (2006.01)

(52) U.S. Cl.
CPC .......... *G06F 3/04166* (2019.05); *G06F 3/044* (2013.01); *G06F 3/0416* (2013.01);
(Continued)

(58) Field of Classification Search
CPC ......... G06F 2203/04111; G06F 3/0412; G06F 3/044; G06F 3/0416; H04L 27/323;
(Continued)

(56) References Cited

U.S. PATENT DOCUMENTS 9,389,736 B2 7/2016 Kim et al.
9,465,463 B2 10/2016 Lee
(Continued)

FOREIGN PATENT DOCUMENTS

KR 10-2012-0119368 10/2012
KR 10-2014-0062341 5/2014
(Continued)

OTHER PUBLICATIONS

Korean Notice of Allowance dated Dec. 27, 2021.

*Primary Examiner* — Christopher E Leiby
(74) *Attorney, Agent, or Firm* — F. Chau & Associates, LLC

(57) ABSTRACT

A touch sensor includes: a substrate that includes active and non-active regions; driving cells disposed on the active region that extend in a first direction; sensing cells disposed on the active region that extend in a second direction that intersects the first direction; a first connection pattern that connects adjacent driving cells; a second connection pattern that connects adjacent sensing cells; and a touch driver disposed on the non-active region that includes thin film transistors that transmit a driving signal to each of the driving cells. The thin film transistor includes: a semiconductor layer; a gate electrode disposed on the semiconductor layer with a first insulating layer interposed therebetween; and source and drain electrodes connected to the semiconductor layer and spaced apart from each other. The first connection pattern is disposed in the same layer as at least one of the source or drain electrodes or the gate electrode.

13 Claims, 13 Drawing Sheets

(52) U.S. Cl.
CPC .......... *G06F 3/0442* (2019.05); *G06F 3/0443* (2019.05); *G06F 3/0445* (2019.05); *G06F 3/0446* (2019.05); *G06F 3/04164* (2019.05); *G06F 2203/04111* (2013.01); *G09G 2310/0264* (2013.01); *H01L 27/323* (2013.01)

(58) Field of Classification Search
CPC ...... H04L 29/78636; G09G 2310/0264; G02F 1/13338; G02F 1/136227; G02F 1/13454; G02F 2001/13629; G02F 2001/134372; G02F 2001/133357
See application file for complete search history.

(56) References Cited

U.S. PATENT DOCUMENTS

| | | |
|---|---|---|
| 9,753,590 B2 | 9/2017 | Won et al. |
| 2003/0111686 A1* | 6/2003 | Nowak ............. H01L 29/78636 257/328 |
| 2014/0232950 A1 | 8/2014 | Park et al. |
| 2014/0253473 A1 | 9/2014 | Kim et al. |
| 2015/0194443 A1 | 7/2015 | Chen et al. |
| 2016/0093647 A1 | 3/2016 | Kim et al. |
| 2016/0117026 A1 | 4/2016 | Ahn et al. |
| 2016/0154499 A1 | 6/2016 | Bae et al. |
| 2016/0320899 A1* | 11/2016 | Watazu ................... G06F 3/047 |
| 2017/0003786 A1 | 1/2017 | Kim et al. |
| 2017/0371462 A1 | 12/2017 | Kim et al. |
| 2018/0188584 A1 | 7/2018 | Yeh |
| 2018/0210603 A1 | 7/2018 | Won et al. |
| 2019/0018516 A1 | 1/2019 | Kim et al. |

FOREIGN PATENT DOCUMENTS

| | | |
|---|---|---|
| KR | 10-2014-0109101 | 9/2014 |
| KR | 10-2015-6144258 | 12/2015 |
| KR | 10-2016-0049145 | 5/2016 |
| KR | 10-2016-0065396 | 6/2016 |
| KR | 10-1670402 | 10/2016 |
| KR | 10-2017-0003388 | 1/2017 |

* cited by examiner

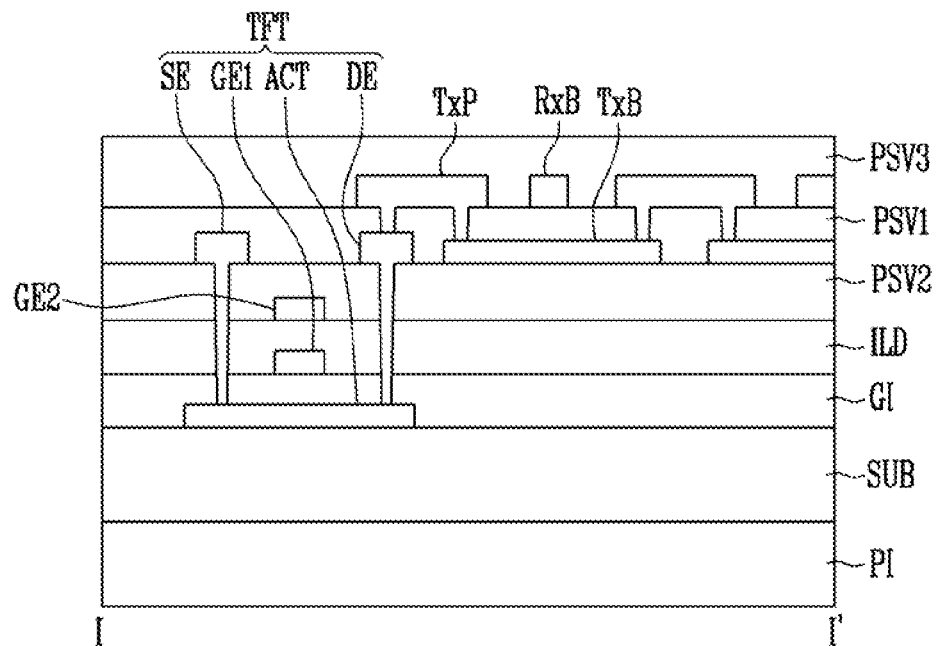
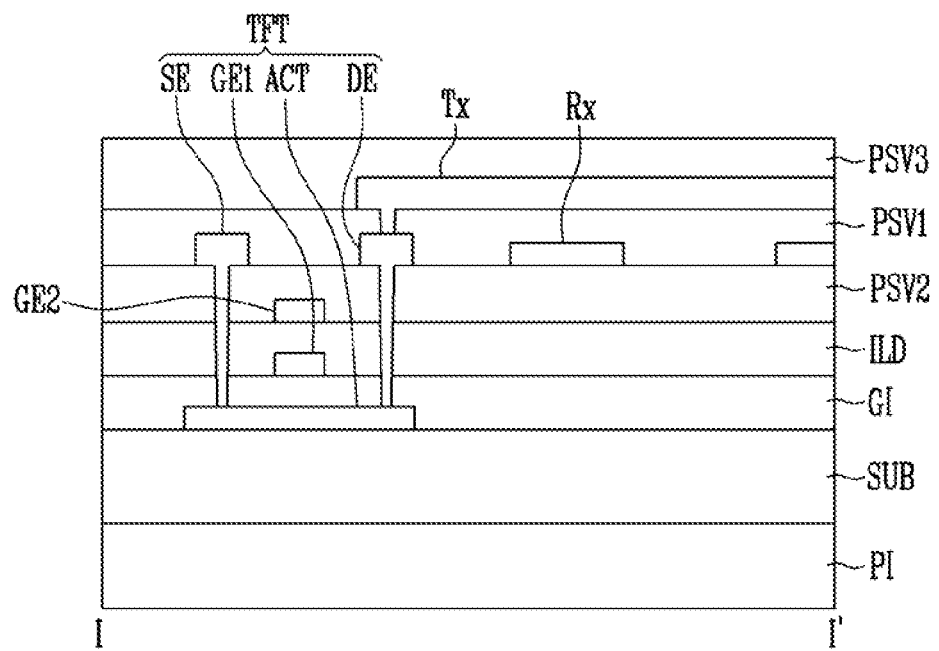

TOUCH SENSOR AND DISPLAY DEVICE INCLUDING THE SAME

CROSS REFERENCE TO RELATED APPLICATIONS

The present application is a divisional of U.S. application Ser. No. 15/870,523, filed on Jan. 12, 2018 in the U.S. Patent and Trademark Office, which claims priority under 35 U.S.C. § 119 from, and the benefit of, Korean Patent Application No. 10-2017-0089804, filed on Jul. 14, 2017 in the Korean Intellectual Property Office, the contents of both of which are herein incorporated by reference in their entireties.

BACKGROUND

1. Technical Field

Embodiments of the present disclosure are directed to a touch sensor and a display device including the same.

2. Discussion of the Related Art

A display device that includes a touch sensor converts a contact position at which the display device is in direct contact with a finger of a user or an object into an electrical signal. Accordingly, an instruction content selected at the contact position is received as an input signal. Since such a display device that includes a touch sensor can be substituted for a separate input device such as a keyboard or mouse, its fields of application have been gradually extended.

There are various methods known for implementing touch sensors, including a resistive layer method, an optical sensing method, an electrostatic capacitance method, etc. A touch sensor that uses an electrostatic capacitance method converts a contact position into an electrical signal by sensing a change in capacitance formed by a conductive sensing pattern along with another adjacent sensing pattern, a ground electrode, etc., when a user's finger or an object is in contact therewith.

SUMMARY

Embodiments can provide a touch sensor in which electrodes for touch sensing and a touch driver are integrally implemented and a display device that includes the touch sensor.

According to an embodiment of the present disclosure, there is provided a touch sensor, including: a substrate that includes an active region and a non-active region; driving cells disposed on the active region that extend in a first direction; sensing cells disposed on the active region that extend in a second direction that intersects the first direction; a first connection pattern that connects adjacent driving cells; a second connection pattern that connects adjacent sensing cells; and a touch driver disposed on the non-active region, the touch driver including thin film transistors that transmit a driving signal to each of the driving cells, wherein the thin film transistor includes: a semiconductor layer; a gate electrode disposed on the semiconductor layer with a first insulating layer interposed therebetween; and source and drain electrodes connected to the semiconductor layer, the source and drain electrodes being spaced apart from each other, wherein the first connection pattern is disposed in the same layer as at least one of the source electrode, the drain electrode, or the gate electrode.

The first connection pattern may be disposed in the same layer as the source electrode and the drain electrode.

The first connection pattern may be disposed in the same layer as the gate electrode.

The sensing cells may be disposed in the same layer as the source electrode and the drain electrode.

The sensing cells may be disposed in the same layer as the gate electrode.

The driving cells may be disposed in the same layer as the sensing cells.

The driving cells and the sensing cells may be disposed in different layers.

The second connection pattern may be disposed in the same layer as the sensing cells.

The driving cells may be disposed in the same layer as the source electrode and the drain electrode.

The touch driver may include: a first touch driver disposed at one side on the non-active region, the first touch driver being connected to the driving cells through first driving lines; and a second touch driver disposed at another side on the non-active region, the second touch driver being connected to the driving cells through second driving lines.

The driving cells may be connected to the first touch driver through different first driving lines, and at least two of the driving cells may be connected to the second touch driver through a same second driving line.

The touch sensor may further include a second insulating layer disposed over the gate electrode, and an additional electrode disposed on the second insulating layer. The additional electrode may form a capacitor together with the gate electrode.

The first connection pattern may be disposed on the same layer as the additional electrode According to an aspect of the present disclosure, there is provided a touch sensor, including: a substrate that includes an active region and a non-active region; driving cells disposed on the active region that extend in a first direction; sensing cells disposed on the active region that extend in a second direction that intersects the first direction; a first connection pattern that connects adjacent driving cells; a second connection pattern that connects adjacent sensing cells; and a touch driver disposed on the non-active region, the touch driver including thin film transistors that transmit a driving signal to each of the driving cells, wherein the thin film transistor includes: a semiconductor layer; a gate electrode disposed on the semiconductor layer with a first insulating layer interposed therebetween; source and drain electrodes connected to the semiconductor layer, the source and drain electrodes being spaced apart from each other; wherein the second connection pattern is disposed in the same layer as the sensing cells.

The first connection pattern may be disposed in the same layer as at least one of the source electrode, the drain electrode, or the gate electrode.

According to an embodiment of the present disclosure, there is provided a display device, including: a display panel that displays an image; and a touch sensor disposed on the display panel that senses a touch, wherein the touch sensor includes: a substrate that includes an active region and a non-active region; driving cells disposed on the active region that extend in a first direction; sensing cells disposed on the active region that extend in a second direction that intersects the first direction; a touch driver disposed on the non-active region that includes thin film transistors that transmit a driving signal to each of the driving cells; and a digitizer disposed on the substrate that includes first and second digitizer patterns.

The touch sensor may further include a first connection pattern that connects the driving cells and a second connection pattern that connects the sensing cells, and the thin film transistor may include a semiconductor layer, a gate electrode disposed on the semiconductor layer with a first insulating layer interposed therebetween, and source and drain electrodes connected to the semiconductor layer, the source and drain electrodes being spaced apart from each other.

The first digitizer pattern may be disposed in the same layer as the source electrode and the drain electrode.

The first digitizer pattern may be disposed in the same layer as the first connection pattern.

The second digitizer pattern may be disposed in the same layer as the gate electrode.

BRIEF DESCRIPTION OF THE DRAWINGS

FIGS. 5A to 5J are sectional views taken along line I-I' of FIG. 3A, according to embodiments of the disclosure.

DETAILED DESCRIPTION

Figure 1:
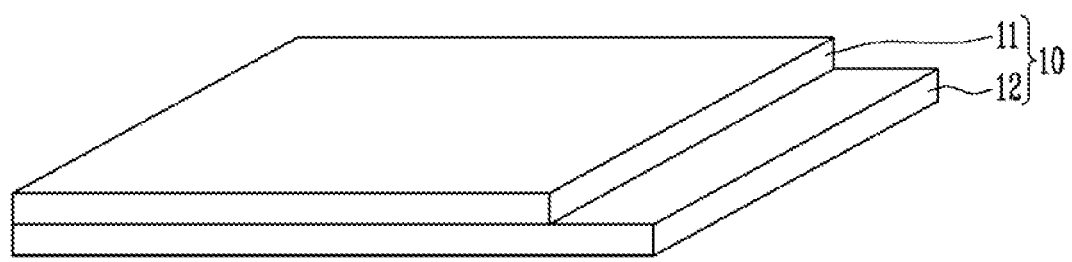
FIG. 1 illustrates a display device according to an embodiment of the present disclosure.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

The specific structural or functional description disclosed herein is merely illustrative for the purpose of describing embodiments according to the concept of the present disclosure. Exemplary embodiments according to the concept of the present disclosure can be implemented in various forms, and cannot be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals may refer to like elements throughout.

It will be understood that when an element is referred to as being "connected" or "coupled" to another element, it can be directly connected or coupled to the other element or intervening elements may also be present.

Figure 2:
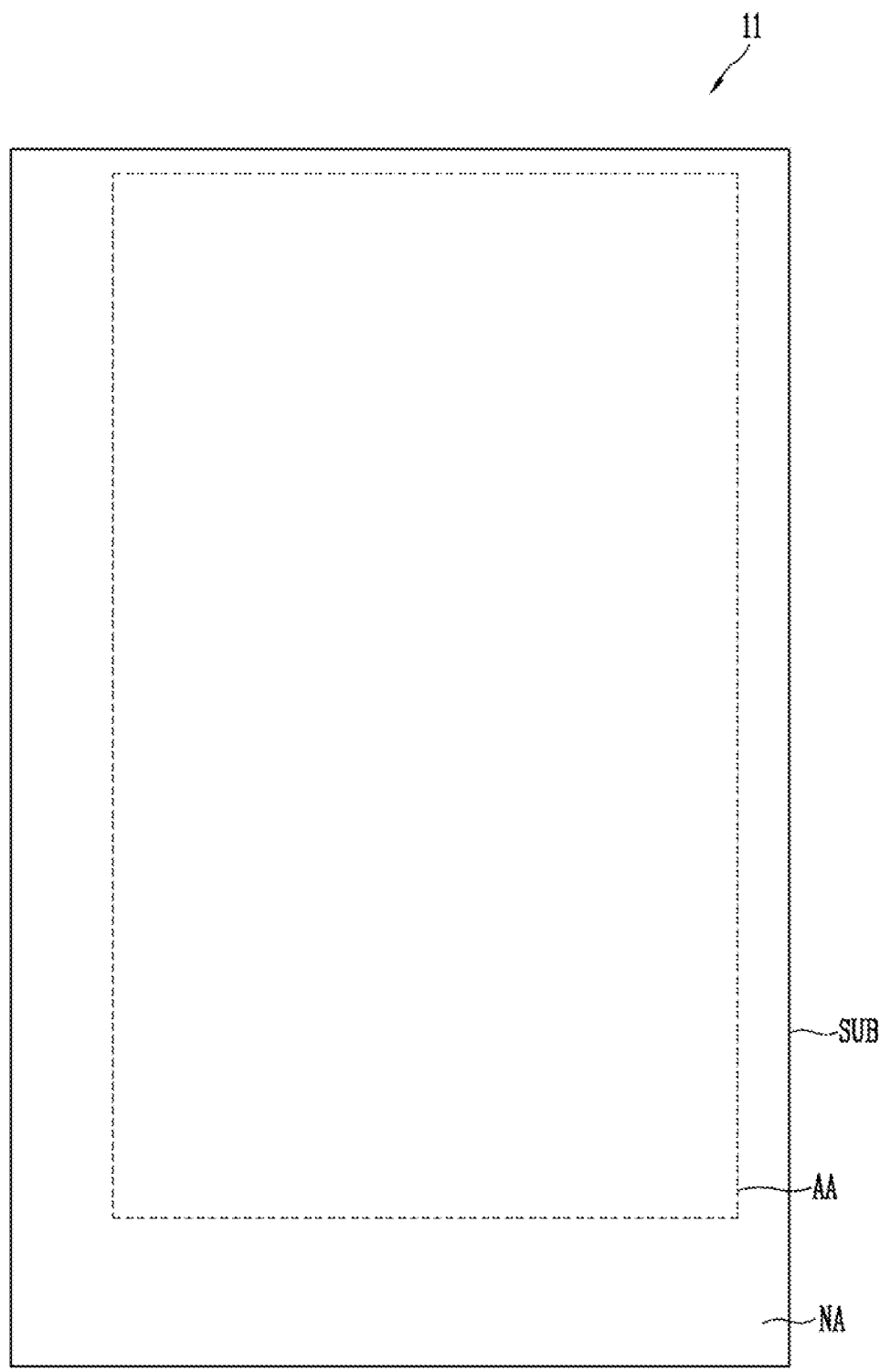
FIG. 2 is a plan view of a display device according to an embodiment of the present disclosure.

FIG. 1 illustrates a display device according to an embodiment of the present disclosure. FIG. 2 is a plan view of a display device according to an embodiment of the present disclosure.

Referring to FIG. 1, a display device 10 according to an embodiment of the present disclosure include a display panel 12 that displays an image and a touch sensor 11 disposed on one surface of the display panel 12.

According to an embodiment, display device 10 has a rectangular plate shape having two pairs of sides parallel to each other. When the display device 10 has a rectangular plate shape, any one pair of the two pairs of sides is longer than the other pair of sides. However, embodiments of the present disclosure are not limited thereto, and the display device 10 may have various shapes, such as a square shape, a circular shape, or a rectangular shape with curved corners.

According to an embodiment, the touch sensor 11 recognizes a touch event generated by a user's finger or other input means.

That is, according to an embodiment, the touch sensor 11 generates information on a position at which a touch event is generated, i.e., touch information.

According to an embodiment, the touch sensor 11 senses a touch or a pressure by using sensing electrodes, but embodiments of the touch sensor 1 are not limited thereto. For example, the touch sensor 11 may be implemented using an electrostatic capacitance method, a piezoresistive method, etc.

In some embodiments, the touch sensor 11 can recognize a user's fingerprint.

A user's fingerprint includes valleys and ridges.

That is, according to an embodiment, the touch sensor 11 generates position information regarding the valleys and the ridges included in the user's fingerprint, i.e., fingerprint information.

In some embodiments, the touch sensor 11 recognizes a user's palm print.

Like a user's fingerprint, a user's palm print includes valleys and ridges.

That is, according to an embodiment, the touch sensor 11 generates position information regarding the valleys and the ridges included in a user's palm print, i.e., palm print information. The touch sensor 11 is provided on a surface on which an image is displayed, and is integrally incorporated into the display panel 12. In an embodiment of the present disclosure, for convenience of explanation, a case in which the touch sensor 11 is provided on an upper surface of the display panel 12 is described as a non-limiting example.

According to an embodiment, the display panel 12 displays, on one surface thereof, visual information, such as text, videos, pictures, a two-dimensional or three-dimensional image, etc., and the visual information is displayed as an image. However, embodiments of the display panel 12 are not particularly limited to those that display images.

Referring to FIG. 2, according to an embodiment, the touch sensor 11 includes a substrate SUB divided into an active region AA in which a touch can be sensed and a non-active region NA in which no touch can be sensed.

According to an embodiment, the substrate SUB can be made of various materials, such as glass, polymer metal, etc. In particular, the substrate SUB is an insulative substrate made of a polymer organic material. The polymer organic material may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, etc. However, materials constituting the substrate SUB are not limited thereto. For example, in other embodiments, the substrate SUB can be made of a fiber reinforced plastic (FRP).

According to an embodiment, the active region AA is located in a central portion of the substrate SUB and has an area relatively larger than that of the non-active region NA. In addition, the active region AA may have various shapes. For example, shapes of the active region AA include a closed polygon with linear sides, a circle, an ellipse, etc., that include curved sides, or a semicircle, a semi-ellipse, etc., that include linear and curved sides. In an embodiment of the present disclosure, for convenience of explanation, a case in which the active region AA has a rectangular shape that includes linear sides is described as a non-limiting example.

According to an embodiment, the active region AA overlaps a display region in which an image is displayed, in a plan view. The active region AA has an area substantially equal to that of the display region, or may have an area larger than that of the display region.

According to an embodiment, the active region AA refers to a region in which a touch can be sensed if an object actually approaches the touch sensor 11 or is in contact with the touch sensor 11. According to embodiments, the contact includes not only a case in which an external object such as a user's finger is in direct contact with the touch sensor 11, but also a case in which an external object is hovering as it approaches the touch sensor 11.

According to an embodiment, the non-active region NA is disposed on at least one side of the active region AA. For example, the non-active region NA surrounds all four sides of the active region AA, or is disposed along one of the four sides of the active region AA.

According to an embodiment, FIG. 2 illustrates the active region AA as a portion of the substrate SUB. However, embodiments of the present disclosure are not limited thereto, and the active region AA may include the entire region of the substrate SUB.

Figure 3A:
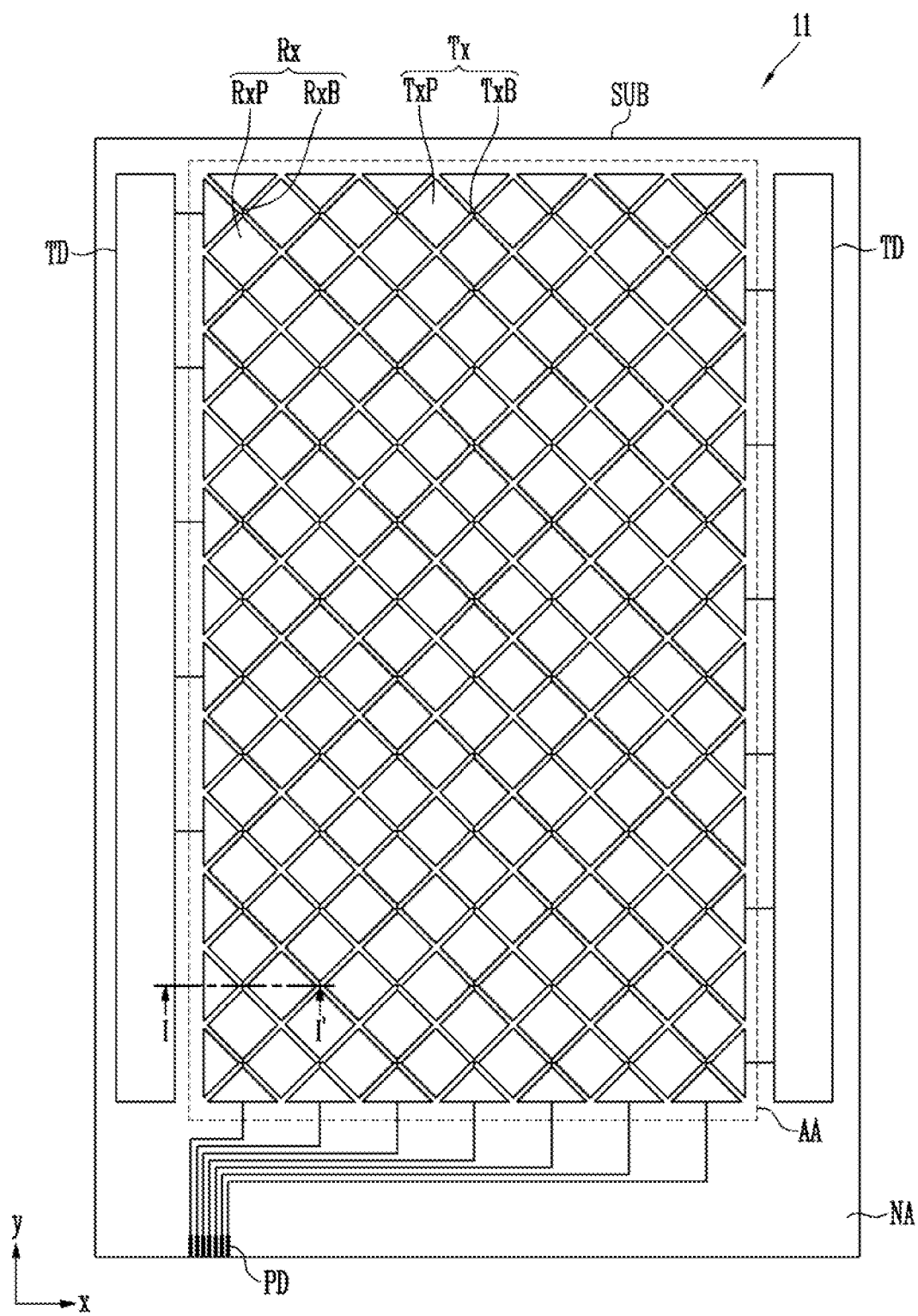
FIG. 3A is a plan view of a touch sensor according to an embodiment of the present disclosure.
Figure 3B:
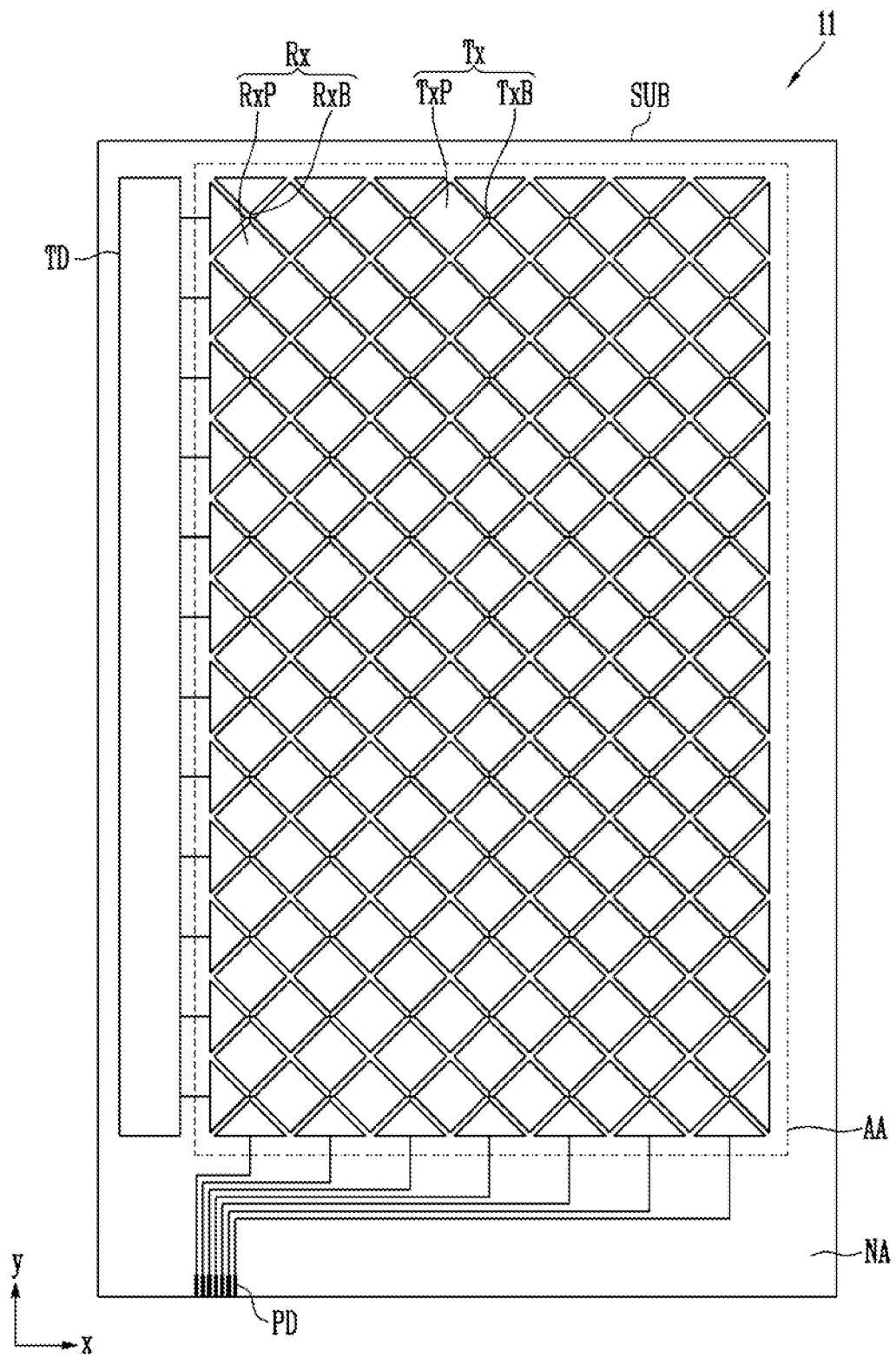
FIG. 3B is a plan view of a touch sensor according to another embodiment of the present disclosure.

FIG. 3A is a plan view of a touch sensor according to an embodiment of the present disclosure. FIG. 3B is a plan view of a touch sensor according to another embodiment of the present disclosure.

Referring to FIGS. 3A and 3B, according to an embodiment, the touch sensor 11 include a plurality of driving electrodes Tx, a plurality of sensing electrodes Rx, a plurality of connection pads PD, and a at least one touch driver TD.

According to an embodiment, the driving electrodes Tx and the sensing electrodes Rx are disposed in the active region AA of the substrate SUB and intersect each other.

According to an embodiment, the driving electrodes Tx extend in a first direction, such as an x-axis direction, and are spaced apart in a second direction, such as a y-axis direction, that intersects the first direction. The sensing electrodes Rx extend in the second direction, and are spaced apart in the first direction.

According to an embodiment, the driving electrodes Tx include a plurality of driving cells TxP disposed at predetermined positions along the first direction, and a plurality of first connection patterns TxB that electrically connect the driving cells TxP to each other.

According to an embodiment, the sensing electrodes Rx include a plurality of sensing cells RxP disposed at predetermined positions along the second direction and are arranged between driving cells TxP so as not to overlap the driving cells TxP, and a plurality of second connection patterns RxB that electrically connect the sensing cells RxP to each other.

According to an embodiment, the driving cells TxP and the sensing cells RxP can have various shapes, such as polygonal shapes that include rectangular shapes such as a bar shape or a diamond shape. In some embodiments, the driving cells TxP and the sensing cells RxP have a whole plate shape or are provided as a mesh that includes fine lines. To this end, the driving cells TxP and the sensing cells RxP can be configured with thin metallic lines that form a plurality of openings.

In addition, according to an embodiment, the driving cells TxP and the sensing cells RxP are formed of a transparent conductive material, such as indium tin oxide (ITO), carbon nano tubes (CNT), or graphene.

According to an embodiment, FIG. 3A illustrates the driving cells TxP as being connected to the touch driver TD through separate lines. However, embodiments of the present disclosure are not limited thereto, and the driving cells TxP can be directly connected to thin film transistors of the touch driver TD.

According to an embodiment, the sensing electrodes Rx are connected to the connection pads PD through sensing lines. In some embodiments, each of the sensing lines is made of a transparent conductive material. However, embodiments of the present disclosure are not limited thereto, and the sensing lines can be formed of a low-resistance material such as molybdenum (Mo), silver (Ag), titanium (Ti), copper (Cu), aluminum (Al), or molybdenum/aluminum/molybdenum (Mo/Al/Mo).

In addition, according to an embodiment, the driving electrodes Tx and the sensing electrodes Rx are insulated from each other. In particular, FIG. 3A illustrates the first connection pattern TxB and the second connection pattern RxB as intersecting each other. However, the first connection pattern TxB and the second connection pattern RxB are actually insulated from each other with an insulating layer interposed therebetween.

In some embodiments, the driving electrodes Tx and the sensing electrodes Rx are provided in the same layer or in different layers. However, the first connection pattern TxB and the second connection pattern RxB are provided in different layers.

According to an embodiment, the touch drivers TD transmit a driving signal to the driving cells TxP of the touch sensor 11. The touch drivers TD include a plurality of thin film transistors that control the transmission times of the driving signals. Each thin film transistor is individually connected to each row of the driving cells TxP to transmit the driving signal to the driving cells TxP during different time periods.

According to an embodiment, the touch drivers TD are disposed in the non-active region NA of the substrate SUB. When viewed on a plane, the touch drivers TD are spaced apart from each other with the active region AA interposed therebetween, but embodiments of the present disclosure are not limited thereto. That is, the touch drivers TD can be disposed adjacent to each other or be disposed on at least one side of the active region AA.

In addition, according to embodiments, a plurality of touch drivers TD can be provided as shown in FIG. 3A, or single touch driver can be provided as shown in FIG. 3B. The number of touch drivers TD is not limited to the embodiments of FIGS. 3A and 3B, and can vary in other embodiments.

According to an embodiment, the connection pads PD are connected to the sensing cells RxP through sensing lines, and transmit sensing signals generated from the sensing cells RxP to a touch controller that calculates a touch position.

According to an embodiment, the connection pads PD and the sensing lines are made of a conductive material. The conductive material may include metals, alloys thereof, a conductive polymer, a conductive metal oxide, a nano conductive material, etc. In an embodiment of the present disclosure, examples of metals include copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, etc. Examples of a conductive polymer include polythiophene-based, polypyrrole-based, polyaniline-based, polyacetylene-based, or polyphenylene-based compounds, mixtures thereof, etc. In particular, a PEDOT/PSS compound of the polythiophene-based compounds is used as the conductive polymer. Examples of a conductive metal oxide include indium tin oxide (ITO), indium zinc oxide (IZO), antimony zinc oxide (AZO), indium tin zinc oxide (ITZO), zinc oxide (ZnO), tin oxide ($SnO_2$), etc. In addition, examples of a nano conductive compound include silver nanowire (AgNW), carbon nano tube (CNT), graphene, etc.

Figure 3C:
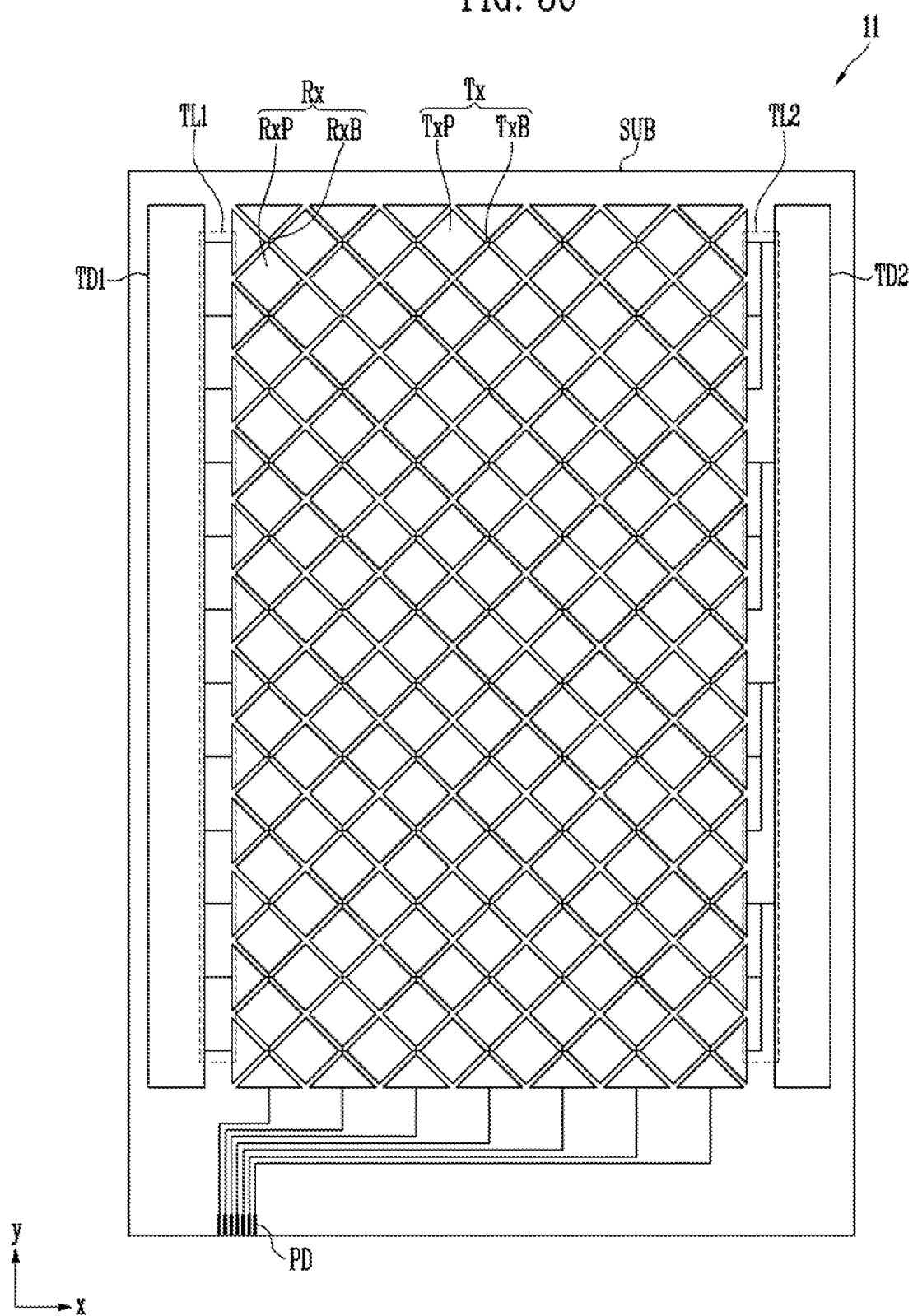
FIG. 3C is a plan view of a touch sensor according to still another embodiment of the present disclosure.

FIG. 3C is a plan view of a touch sensor according to still another embodiment of the present disclosure.

For convenience of explanation, descriptions of components included with the touch sensor shown in FIG. 3A will be omitted.

Referring to FIG. 3C, according to an embodiment, the touch sensor 11 includes driving electrodes Tx, sensing electrodes Rx, connection pads PD, first driving lines TL1, second driving lines TL2, a first touch driver TD1, and a second touch driver TD2.

According to an embodiment, the driving cells TxP are connected to the first touch driver TD1 through the first driving lines TL1. However, embodiments of the present disclosure are not limited thereto, and the driving cells TxP can be directly connected to thin film transistors of the first touch driver TD1.

According to an embodiment, the driving cells TxP are connected to the second touch driver TD2 through the second driving lines TL2. However, embodiments of the present disclosure are not limited thereto, and the driving cells TxP can be directly connected to thin film transistors of the second touch driver TD2.

As shown in FIG. 3C, according to an embodiment, the first driving lines TL1 have a first line structure, and the second driving lines TL2 have a second line structure.

For example, the first line structure is a line structure in which the driving cells TxP are connected to the first touch driver TD1 through different first driving lines TL1.

For example, the second line structure is a line structure in which at least two of the driving cells TxP are connected to the second touch driver TD2 through a same second driving line TL2.

According to an embodiment, FIG. 3C illustrates that any one second driving line TL2 extending from the second touch driver TD2 is connected to three driving cells, but embodiments of the present disclosure are not limited thereto. In some embodiments, any one second driving line TL2 extending from the second touch driver TD2 can be connected to two or four or more driving cells.

In some embodiments, unlike the embodiment shown in FIG. 3C, the first driving lines TL1 have the second line structure, and the second driving lines TL2 have the first line structure.

Figure 4A:
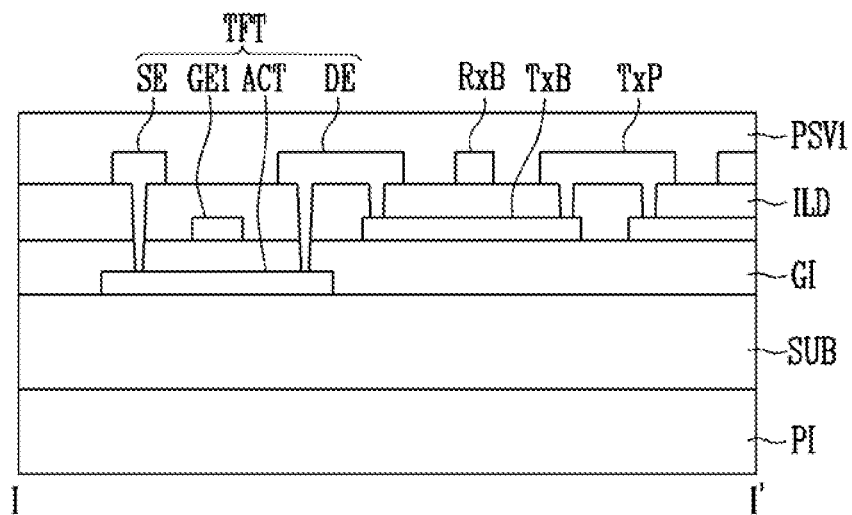
FIGS. 4A and 4B are sectional views taken along line I-I' of FIG. 3A, according to embodiments of the disclosure.
Figure 4B:
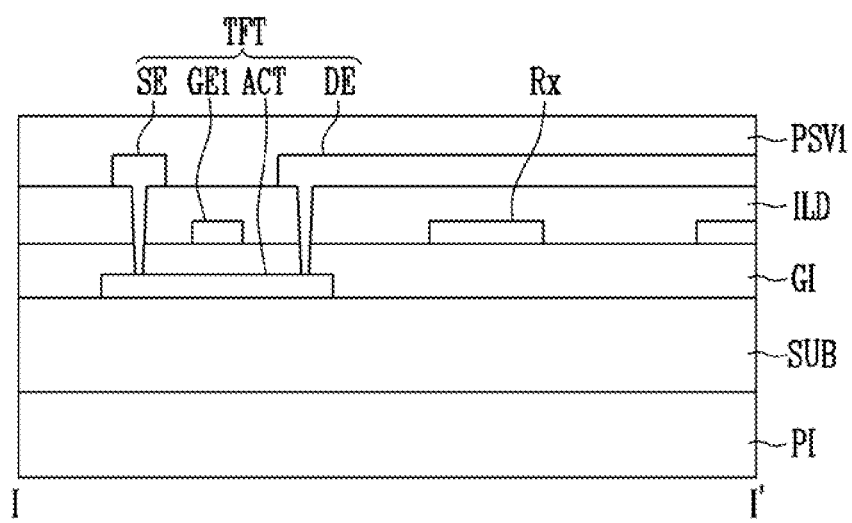

FIGS. 4A and 4B are sectional views taken along line I-I' of FIG. 3A, according to embodiments of the disclosure.

According to an embodiment, FIG. 4A shows a sectional structure of the touch sensor 11, which illustrates a stacked structure of the touch sensor 11. Hereinafter, the touch sensor 11 of the present disclosure is described in a stacking order.

According to an embodiment, an adhesive layer PI is disposed between the display panel 12 and the touch sensor 11, and adheres an upper surface of the display panel 12 to a lower surface of the touch sensor 11. The adhesive layer PI is made of a photocurable resin or thermosetting resin that has a high transmittance and good adhesive performance.

For example, the adhesive layer PI can be formed by applying a resin such as acryl and then irradiating ultraviolet light (UV) onto the resin to cure the resin. Since the adhesive layer PI has good elasticity, the adhesive layer PI protects the display panel 12 from external impacts, thereby improving the mechanical stability and reliability of the display device 10.

According to an embodiment, a substrate SUB is disposed on the adhesive layer PI, and a thin film transistor TFT is disposed on the substrate SUB. Specifically, a semiconductor layer ACT is disposed on the substrate SUB. The semiconductor layer ACT is formed of a semiconductor material. The semiconductor layer ACT includes a source region, a drain region, and a channel region provided between the source region and the drain region. The semiconductor layer ACT is a semiconductor pattern made of poly-silicon, amorphous silicon, semiconductor oxide, etc. The channel region is a semiconductor pattern undoped with impurities, and is an intrinsic semiconductor. The source region and the drain region are semiconductor patterns doped with impurities.

According to an embodiment, a gate insulating layer GI is disposed on the substrate SUB on which the semiconductor layer ACT is disposed. The gate insulating layer GI may be an inorganic insulating layer that includes an inorganic material, or an organic insulating layer that includes an organic material.

According to an embodiment, a gate electrode GE1 is disposed on the gate insulating layer GI. The gate electrode GE1 covers a region that corresponds to the channel region of the semiconductor layer ACT. The gate electrode GE1 is made of a metal.

For example, the gate electrode GE1 may be made of at least one metal such as gold (Au), silver (Ag), aluminum (Al), molybdenum (Mo), chromium (Cr), titanium (Ti), nickel (Ni), neodymium (Nd), or copper (Cu), or alloys thereof.

In addition, according to an embodiment, the gate electrode GE can be formed in a single layer, but embodiments of the present disclosure are not limited thereto. For example, the gate electrode GE1 can have multiple layers in which two or more metals or alloys are stacked.

In addition, according to an embodiment, a first connection pattern TxB is disposed on the gate insulating layer GI. The first connection pattern TxB is formed in the same layer as the gate electrode GE1, and is formed of the same material through the same process.

According to an embodiment, an interlayer insulating layer ILD is disposed on the gate insulating layer GI on which the gate electrode GE1 and the first connection pattern TxB are disposed. The interlayer insulating layer ILD is an inorganic insulating layer that includes an inorganic material. The inorganic material includes polysiloxane, silicon nitride, silicon oxide, silicon oxynitride, etc.

According to an embodiment, a source electrode SE and a drain electrode DE are disposed on the interlayer insulating layer ILD. The source electrode SE and the drain electrode DE are respectively connected to the source region and the drain region of the semiconductor layer ACT through contact holes that penetrate the interlayer insulating layer ILD and the gate insulating layer GI.

According to an embodiment, FIG. 4A illustrates the drain electrode DE as a partial component of the thin film transistor TFT, but the drain electrode DE can be used as a driving cell TxP for touch sensing.

According to an embodiment, the source electrode SE and the drain electrode DE are made of metal. For example, the source electrode SE and the drain electrode DE may be made of at least one metal such as gold (Au), silver (Ag), aluminum (Al), molybdenum (Mo), chromium (Cr), titanium (Ti), nickel (Ni), neodymium (Nd), and copper (Cu), or alloys thereof.

According to an embodiment, the source electrode SE and the drain electrode DE are formed as a single layer, but embodiments of the present disclosure are not limited thereto. For example, the source electrode SE and the drain electrode DE can have multiple layers in which two or more metals or alloys are stacked.

According to an embodiment, driving cells TxP, sensing cells RxP, and a second connection pattern RxB are disposed on the interlayer insulating layer ILD. The driving cell TxP is connected to the first connection pattern TxB through a contact hole that penetrates the interlayer insulating layer ILD.

According to an embodiment, the source electrode SE, the drain electrode DE, the driving cells TxP, the sensing cells RxP, and the second connection pattern RxB are formed in the same layer, and are formed of the same material through the same process.

In an embodiment of the present disclosure, the thin film transistor TFT includes the semiconductor layer ACT, the gate electrode GE1, the source electrode SE, and the drain electrode DE. A case in which the thin film transistor TFT has a top gate structure is illustrated as an example, but embodiments of the present disclosure are not limited thereto. For example, the thin film transistor TFT may have a bottom gate structure.

According to an embodiment, a first protective layer PSV1 that covers the thin film transistor TFT is disposed on the interlayer insulating layer ILD on which the source electrode SE and the drain electrode DE are disposed. The first protective layer PSV1 is an organic insulating layer that includes an organic insulating material. Examples of an organic insulating material including a polyacryl-based compound, a polyimide-based compound, a fluorine-based compound such as Teflon, a benzocyclobutene-based compound, etc.

According to an embodiment, FIG. 4B illustrates a touch sensor having a structure different from that of the touch sensor shown in FIG. 4A. In FIG. 4B, for convenience of explanation, differences with respect to the above-described embodiment will be mainly described to avoid redundancy.

According to an embodiment, a substrate SUB is disposed on an adhesive layer PI, and a thin film transistor TFT is disposed on the substrate SUB. Specifically, a semiconductor layer ACT is disposed on the substrate SUB.

According to an embodiment, a gate insulating layer GI is disposed on the substrate SUB on which the semiconductor layer ACT is disposed. A gate electrode GE1 is disposed on the gate insulating layer GI.

In addition, according to an embodiment, sensing electrodes Rx are disposed on the gate insulating layer GI. The sensing electrodes Rx include sensing cells RxP and a second connection pattern RxB.

According to an embodiment, the gate electrode GE1 and the sensing electrodes Rx are formed in the same layer, and are formed of the same material through the same process.

According to an embodiment, an interlayer insulating layer ILD is disposed on the gate insulating layer GI on which the gate electrode GE1 and the sensing electrodes Rx are disposed.

According to an embodiment, a source electrode SE and a drain electrode DE are disposed on the interlayer insulating layer ILD. The source electrode SE and the drain electrode DE are connected to a source region and a drain region of the semiconductor layer ACT through contact holes that penetrate the interlayer insulating layer ILD and the gate insulating layer GI, respectively.

According to an embodiment, the source electrode SE and the drain electrode DE are formed in the same layer, and be formed of the same material through the same process.

According to an embodiment, FIG. 4B illustrates the drain electrode DE as a partial component of the thin film transistor TFT, but the drain electrode DE can be used as a driving cell TxP for touch sensing.

According to an embodiment, a first protective layer PSV1 that covers the thin film transistor TFT is disposed provided on the interlayer insulating layer ILD on which the source electrode SE and the drain electrode DE are disposed.

FIGS. 5A to 5J are sectional views taken along line I-I' of FIG. 3A, according to embodiments of the disclosure.

In FIGS. 5A to 5J, differences with respect to the above-described embodiments will be mainly described to avoid redundancy. Components not particularly described in FIGS. 5A to 5J are substantially similar those of the above-described embodiments. In addition, identical reference numbers refer to identical components, and similar reference numbers refer to similar components.

Figure 5A:
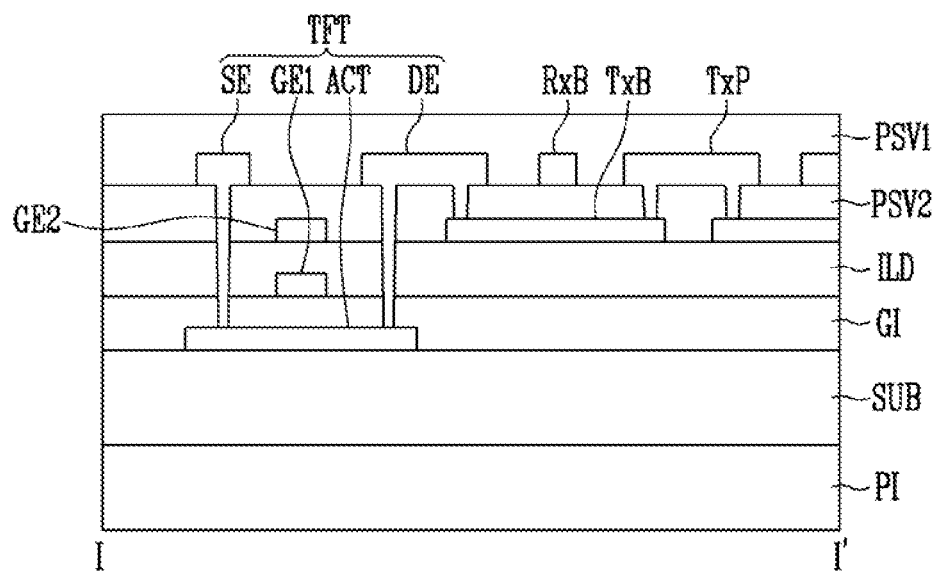

Referring to FIG. 5A, according to embodiments of the disclosure an adhesive layer PI is disposed under a substrate SUB, and a thin film transistor TFT is disposed on the substrate SUB. Specifically, a semiconductor layer ACT is disposed on the substrate SUB.

According to an embodiment, a gate insulating layer GI is disposed provided on the substrate SUB on which the semiconductor layer ACT is disposed. A gate electrode GE1 is disposed on the gate insulating layer GI.

According to an embodiment, an interlayer insulating layer ILD is disposed on the gate insulating layer GI on which the gate electrode GE1 is disposed.

According to an embodiment, an additional electrode GE2 that forms a capacitor together with the gate electrode GE1 is disposed on the interlayer insulating layer ILD.

According to an embodiment, the additional electrode GE2 is made of a metal. For example, the additional electrode GE2 is made of at least one metal such as gold (Au), silver (Ag), aluminum (Al), molybdenum (Mo), chromium (Cr), titanium (Ti), nickel (Ni), neodymium (Nd), or copper (Cu), or alloys thereof.

In addition, according to an embodiment, the additional electrode GE2 is formed in a single layer, but embodiments of the present disclosure are not limited thereto. For example, the additional electrode GE2 can have multiple layers in which two or more metals or alloys are stacked.

According to an embodiment, a first connection pattern TxB is disposed on the interlayer insulating layer ILD on which the additional electrode GE2 is disposed. The additional electrode GE2 and the first connection pattern TxB are formed in the same layer, and are formed of the same material through the same process.

According to an embodiment, a second protective layer PSV2 is disposed on the interlayer insulating layer ILD on which the additional electrode GE2 and the first connection pattern TxB are disposed. The second protective layer PSV2 is an organic insulating layer that includes an organic insulating material. Examples of an organic insulating material include a polyacryl-based compound, a polyimide-based compound, a fluorine-based compound such as Teflon, a benzocyclobutene-based compound, etc. In addition, the second protective layer PSV2 is formed in a single layer. However, embodiments of the present disclosure are not limited thereto, and the second protective layer PSV2 can have multiple layers.

According to an embodiment, a source electrode SE and a drain electrode DE are disposed on the second protective layer PSV2. The source electrode SE and the drain electrode DE are respectively connected to a source region and a drain region of the semiconductor layer ACT through contact holes that penetrate the second protective layer PSV2, the interlayer insulating layer ILD, and the gate insulating layer GI. In addition, the drain electrode DE is connected to the first connection pattern TxB through a contact hole that penetrates the second protective layer PSV2.

According to an embodiment, FIG. 5A illustrates the drain electrode DE as being a partial component of the thin film transistor TFT, but the drain electrode DE can used as a driving cell TxP for touch sensing.

In addition, according to an embodiment, driving cells TxP, sensing cells RxP, and a second connection pattern RxB are disposed on the second protective layer PSV2. The driving cell TxP is connected to the first connection pattern TxB through a contact hole that penetrates the second protective layer PSV2.

According to an embodiment, the source electrode SE, the drain electrode DE, the driving cells TxP, the sensing cells RxP, and the second connection pattern RxB are formed in the same layer, and be formed of the same material through the same process.

According to an embodiment, a first protective layer PSV1 that covers the thin film transistor TFT is disposed on the second protective layer PSV2 on which the source electrode SE and the drain electrode DE are disposed.

Figure 5B:
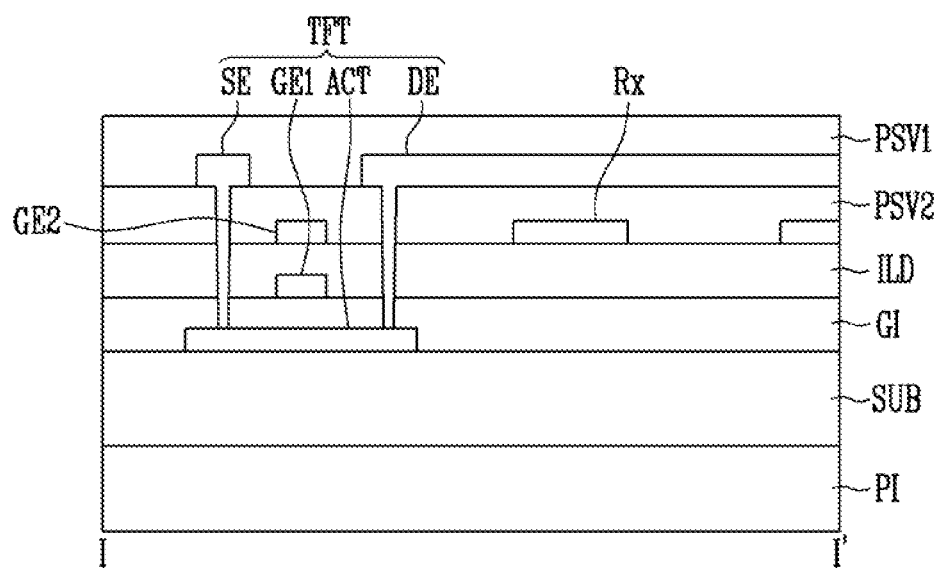

Referring to FIG. 5B, according to an embodiment, an adhesive layer PI is disposed under a substrate SUB, and a thin film transistor TFT is disposed on the substrate SUB. Specifically, a semiconductor layer ACT is disposed on the substrate SUB.

According to an embodiment, a gate insulating layer GI is disposed on the substrate SUB on which the semiconductor layer ACT is disposed. A gate electrode GE1 is disposed on the gate insulating layer GI.

According to an embodiment, an interlayer insulating layer ILD is disposed on the gate insulating layer GI on which the gate electrode GE1 is disposed.

According to an embodiment, an additional electrode GE2 and sensing electrodes Rx are disposed on the interlayer insulating layer ILD. The sensing electrodes Rx include a second connection pattern RxB.

According to an embodiment, the additional electrode GE2 and the sensing electrodes Rx are formed in the same layer, and are formed of the same material through the same process.

According to an embodiment, a second protective layer PSV2 is disposed on the interlayer insulating layer ILD on which the additional electrode GE2 and the sensing electrodes Rx are disposed.

According to an embodiment, source electrode SE and a drain electrode DE are disposed on the second protective layer PSV2. The source electrode SE and the drain electrode DE are respectively connected to a source region and a drain region of the semiconductor layer ACT through contact holes that penetrate the second protective layer PSV2, the interlayer insulating layer ILD, and the gate insulating layer GI.

According to an embodiment, the source electrode SE and the drain electrode DE are formed in the same layer, and are formed of the same material through the same process. Here, the drain electrode DE is used as a driving cell TxP for touch sensing.

According to an embodiment, first protective layer PSV1 that covers the thin film transistor TFT is disposed on the second protective layer PSV2 on which the source electrode SE and the drain electrode DE are disposed.

Figure 5C:
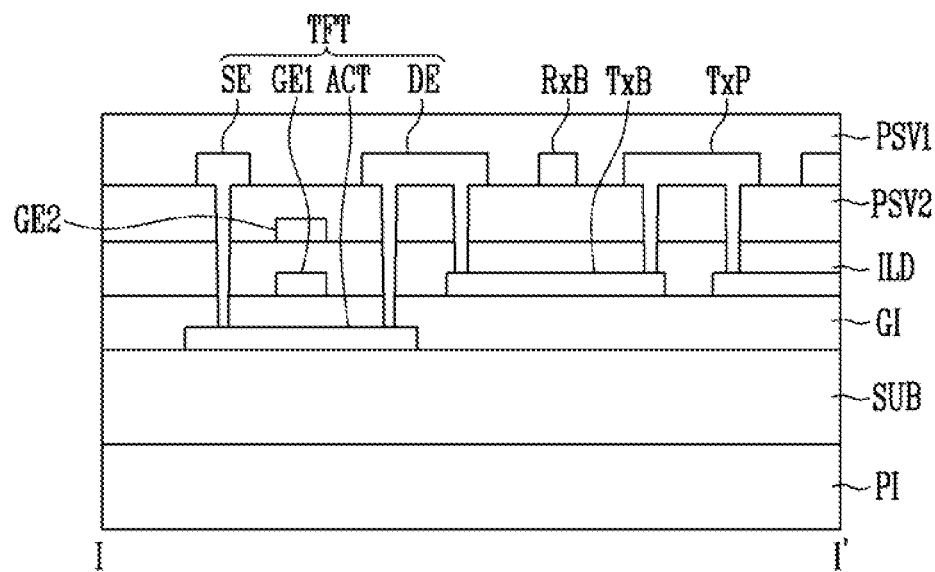

Referring to FIG. 5C, according to an embodiment, an adhesive layer PI is disposed under a substrate SUB, and a thin film transistor TFT is disposed on the substrate SUB. Specifically, a semiconductor layer ACT is disposed on the substrate SUB.

According to an embodiment, a gate insulating layer GI is disposed on the substrate SUB on which the semiconductor layer ACT is disposed. A gate electrode GE1 and a first connection pattern TxB are disposed on the gate insulating layer GI.

According to an embodiment, the gate electrode GE1 and the first connection pattern TxB are formed in the same layer, and are formed of the same material through the same process.

According to an embodiment, an interlayer insulating layer ILD is disposed on the gate insulating layer GI on which the gate electrode GE1 and the first connection pattern TxB are disposed.

According to an embodiment, an additional electrode GE2 is disposed on the interlayer insulating layer ILD.

According to an embodiment, a second protective layer PSV2 is disposed on the interlayer insulating layer ILD on which the additional electrode GE2 is disposed.

According to an embodiment, source electrode SE and a drain electrode DE are disposed on the second protective layer PSV2. The source electrode SE and the drain electrode DE are respectively connected to a source region and a drain region of the semiconductor layer ACT through contact holes that penetrate the second protective layer PSV2, the interlayer insulating layer ILD, and the gate insulating layer GI. In addition, the drain electrode DE are connected to the first connection pattern TxB through a contact hole that penetrates the second protective layer PSV2 and the interlayer insulating layer ILD.

Here, the drain electrode DE is used as a driving cell TxP for touch sensing.

In addition, according to an embodiment, driving cells TxP, sensing cells RxP, and a second connection pattern RxB are disposed on the second protective layer PSV2.

According to an embodiment, the source electrode SE, the drain electrode DE, the driving cells TxP the sensing cells RxP, and the second connection pattern RxB are formed in the same layer, and are formed of the same material through the same process.

According to an embodiment, a first protective layer PSV1 that covers the thin film transistor TFT is disposed on the second protective layer PSV2 on which the source electrode SE and the drain electrode DE are disposed.

Figure 5D:
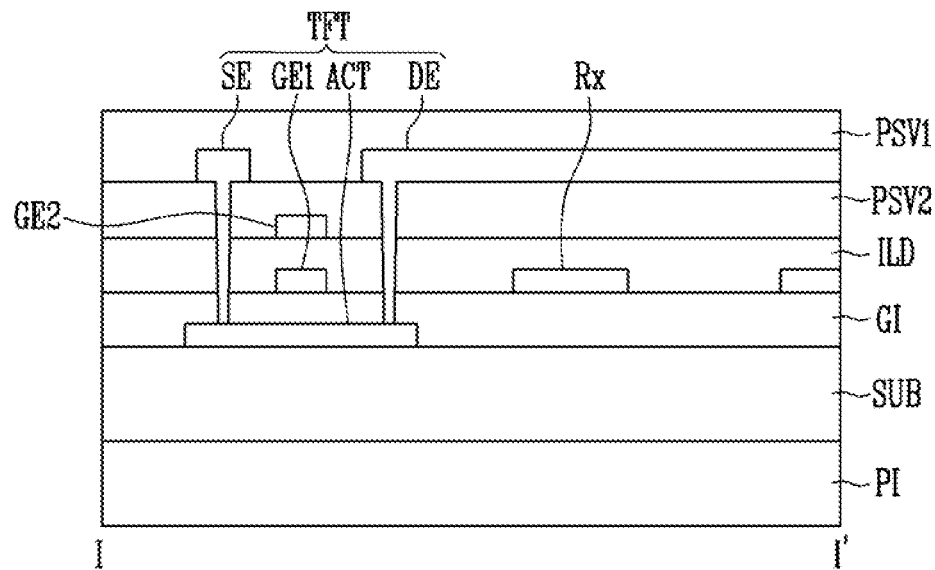

Referring to FIG. 5D, according to an embodiment, an adhesive layer PI is disposed under a substrate SUB, and a thin film transistor TFT is disposed on the substrate SUB. Specifically, a semiconductor layer ACT is disposed on the substrate SUB.

According to an embodiment, a gate insulating layer GI is disposed on the substrate SUB on which the semiconductor layer ACT is disposed. A gate electrode GE1 and sensing electrodes Rx are disposed on the gate insulating layer GI. The gate electrode GE1 and the sensing electrodes Rx are formed in the same layer, and are formed of the same material through the same process.

According to an embodiment, an interlayer insulating layer ILD is disposed on the gate insulating layer GI on which the gate electrode GE1 and the sensing electrodes Rx are disposed.

According to an embodiment, an additional electrode GE2 is disposed on the interlayer insulating layer ILD.

According to an embodiment, a second protective layer PSV2 is disposed on the interlayer insulating layer ILD on which the additional electrode GE2 is disposed.

According to an embodiment, a source electrode SE and a drain electrode DE are disposed on the second protective layer PSV2. The source electrode SE and the drain electrode DE are respectively connected to a source region and a drain region of the semiconductor layer ACT through contact holes that penetrate the second protective layer PSV2, the interlayer insulating layer ILD, and the gate insulating layer GI.

According to an embodiment, the source electrode SE and the drain electrode DE are formed in the same layer, and are formed of the same material through the same process. Here, the drain electrode DE is used as a driving cell TxP for touch sensing.

According to an embodiment, a first protective layer PSV1 that covers the thin film transistor TFT is disposed on the second protective layer PSV2 on which the source electrode SE and the drain electrode DE are disposed.

Referring to FIG. 5E, according to an embodiment, an adhesive layer PI is disposed under a substrate SUB, and a thin film transistor TFT is disposed on the substrate SUB. Specifically, a semiconductor layer ACT is disposed on the substrate SUB.

According to an embodiment, a gate insulating layer GI is disposed on the substrate SUB on which the semiconductor layer ACT is disposed. A gate electrode GE1 is disposed on the gate insulating layer GI. An interlayer insulating layer ILD is disposed on the gate insulating layer GI on which the gate electrode GE1 is disposed.

According to an embodiment, an additional electrode GE2 is disposed on the interlayer insulating layer ILD. A second protective layer PSV2 is disposed on the interlayer insulating layer ILD on which the additional electrode GE2 is disposed.

According to an embodiment, a source electrode SE and a drain electrode DE are disposed on the second protective layer PSV2. The source electrode SE and the drain electrode DE are respectively connected to a source region and a drain region of the semiconductor layer ACT through contact holes that penetrate the second protective layer PSV2, the interlayer insulating layer ILD, and the gate insulating layer GI.

In addition, according to an embodiment, a first connection pattern TxB is disposed on the second protective layer PSV2.

According to an embodiment, the source electrode SE, the drain electrode DE, and the first connection pattern TxB are formed in the same layer, and are formed of the same material through the same process.

According to an embodiment, a first protective layer PSV1 that covers the thin film transistor TFT is disposed on the second protective layer PSV2 on which the source electrode SE, the drain electrode DE, and the first connection pattern TxB are disposed.

According to an embodiment, driving cells TxP, sensing cells RxP, and a second connection pattern RxB are disposed on the first protective layer PSV1. The driving cells TxP are connected to the drain electrode DE and the first connection pattern TxB through contact holes that penetrate the first protective layer PSV1.

According to an embodiment, a third protective layer PSV3 is disposed on the first protective layer PSV1 on which the driving cells TxP, the sensing cells RxP, and the second connection pattern RxB are disposed.

According to an embodiment, the third protective layer PSV3 is an organic insulating layer that includes an organic insulating material. Examples of an organic insulating material include a polyacryl-based compound, a polyimide-based compound, a fluorine-based compound such as Teflon, a benzocyclobutene-based compound, etc. In addition, the third protective layer PSV3 is formed in a single layer. However, embodiments of the present disclosure are not limited thereto, and the third protective layer PSV3 may have multiple layers.

Referring to FIG. 5F, according to an embodiment, an adhesive layer PI is disposed under a substrate SUB, and a thin film transistor TFT is disposed on the substrate SUB. Specifically, a semiconductor layer ACT is disposed on the substrate SUB.

According to an embodiment, a gate insulating layer GI is disposed on the substrate SUB on which the semiconductor layer ACT is disposed. A gate electrode GE1 is disposed on the gate insulating layer GI. An interlayer insulating layer ILD is disposed on the gate insulating layer GI on which the gate electrode GE1 is disposed.

According to an embodiment, an additional electrode GE2 is disposed on the interlayer insulating layer ILD. A second protective layer PSV2 is disposed on the interlayer insulating layer ILD on which the additional electrode GE2 is disposed.

According to an embodiment, a source electrode SE and a drain electrode DE are disposed on the second protective layer PSV2. The source electrode SE and the drain electrode DE are respectively connected to a source region and a drain region of the semiconductor layer ACT through contact holes that penetrate the second protective layer PSV2, the interlayer insulating layer ILD, and the gate insulating layer GI.

In addition, according to an embodiment, sensing electrodes Rx are disposed on the second protective layer PSV2.

According to an embodiment, the source electrode SE, the drain electrode DE, and the sensing electrodes Rx are formed in the same layer, and are formed of the same material through the same process.

According to an embodiment, a first protective layer PSV1 that covers the thin film transistor TFT is disposed on the second protective layer PSV2 on which the source electrode SE, the drain electrode DE, and the sensing electrodes Rx are disposed.

According to an embodiment, driving electrodes Tx are disposed on the first protective layer PSV1. The driving electrodes Tx are connected to the drain electrode DE through contact holes that penetrate the first protective layer PSV1.

According to an embodiment, a third protective layer PSV3 is disposed on the first protective layer PSV1 on which the driving electrodes Tx are disposed.

Figure 5G:
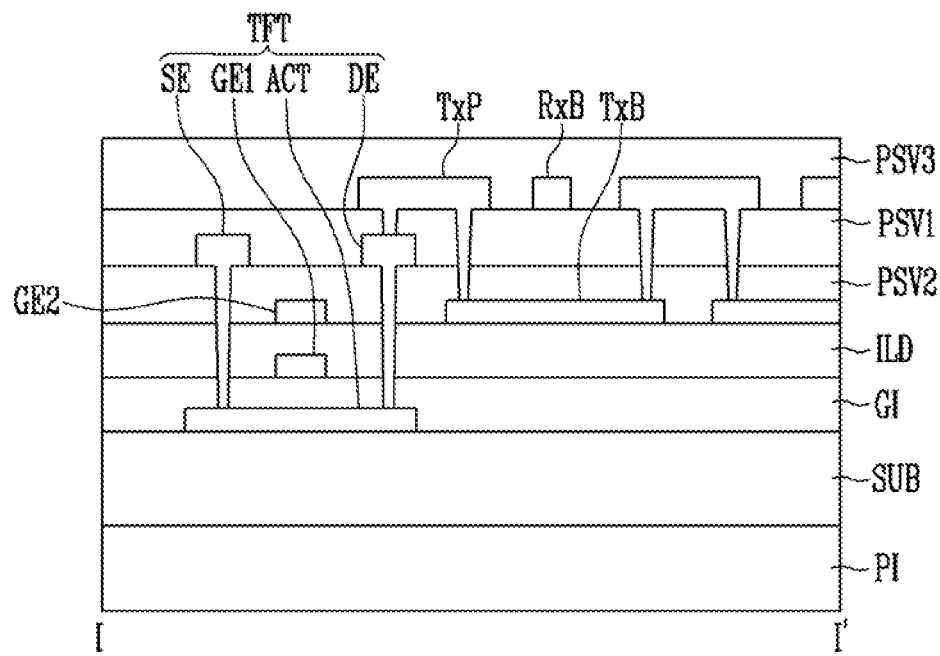

Referring to FIG. 5G, according to an embodiment, an adhesive layer PI is disposed under a substrate SUB, and a thin film transistor TFT is disposed on the substrate SUB. Specifically, a semiconductor layer ACT is disposed on the substrate SUB.

According to an embodiment, a gate insulating layer GI is disposed on the substrate SUB on which the semiconductor layer ACT is disposed. A gate electrode GE1 is disposed on the gate insulating layer GI. An interlayer insulating layer ILD is disposed on the gate insulating layer GI on which the gate electrode GE1 is disposed.

According to an embodiment, an additional electrode GE2 and a first connection pattern TxB are disposed on the interlayer insulating layer ILD. The additional electrode GE2 and the first connection pattern TXB are formed in the same layer, and are formed of the same material through the same process. A second protective layer PSV2 is disposed on the interlayer insulating layer ILD on which the additional electrode GE2 and the first connection pattern TxB are disposed.

According to an embodiment, a source electrode SE and a drain electrode DE are disposed on the second protective layer PSV2. The source electrode SE and the drain electrode DE are respectively connected to a source region and a drain region of the semiconductor layer ACT through contact holes that penetrate the second protective layer PSV2, the interlayer insulating layer ILD, and the gate insulating layer GI.

According to an embodiment, a first protective layer PSV1 that covers the thin film transistor TFT is disposed on the second protective layer PSV2 on which the source electrode SE and the drain electrode DE are disposed.

According to an embodiment, driving cells TxP, sensing cells RxP, and a second connection pattern RxB are disposed on the first protective layer PSV1. The driving cells TxP are connected to the drain electrode DE through contact holes that penetrate the first protective layer PSV1, and are connected to the first connection pattern TxB through a contact hole that penetrates the first and second protective layers PSV1 and PSV2.

According to an embodiment, the driving cells TxP, the sensing cells RxP, and the second connection pattern RxB are formed in the same layer, and are formed of the same material through the same process.

According to an embodiment, a third protective layer PSV3 is disposed on the first protective layer PSV1 on which the driving cells TxP, the sensing cells RxP, and the second connection pattern RxB are disposed.

Figure 5H:
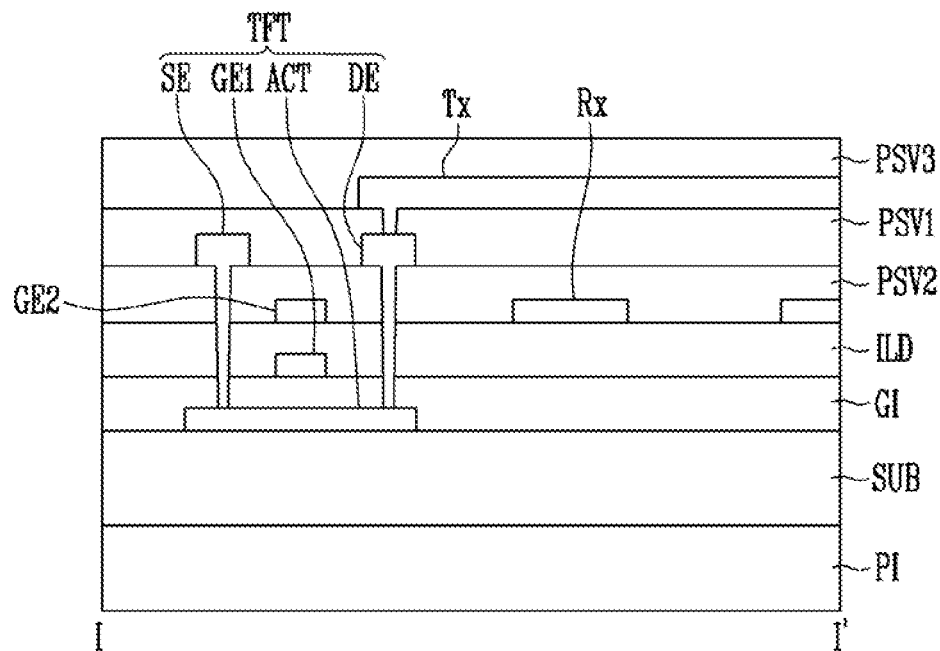

Referring to FIG. 5H, according to an embodiment, an adhesive layer PI is disposed under a substrate SUB, and a thin film transistor TFT is disposed on the substrate SUB. Specifically, a semiconductor layer ACT is disposed on the substrate SUB.

According to an embodiment, a gate insulating layer GI is disposed on the substrate SUB on which the semiconductor layer ACT is disposed. A gate electrode GE1 is disposed on the gate insulating layer GI. An interlayer insulating layer ILD is disposed on the gate insulating layer GI on which the gate electrode GE1 is disposed.

According to an embodiment, an additional electrode GE2 and sensing electrodes Rx are disposed on the interlayer insulating layer ILD. A second protective layer PSV2 is disposed on the interlayer insulating layer ILD on which the additional electrode GE2 and the sensing electrodes Rx are disposed.

According to an embodiment, a source electrode SE and a drain electrode DE are disposed on the second protective layer PSV2. The source electrode SE and the drain electrode DE are respectively connected to a source region and a drain region of the semiconductor layer ACT through contact holes that penetrate the second protective layer PSV2, the interlayer insulating layer ILD, and the gate insulating layer GI.

According to an embodiment, a first protective layer PSV1 that covers the thin film transistor TFT is disposed on the second protective layer PSV2 on which the source electrode SE and the drain electrode DE are disposed.

According to an embodiment, driving electrodes Tx is disposed on the first protective layer PSV1. The driving electrodes Tx is connected to the drain electrode DE through contact holes that penetrate the first protective layer PSV1.

According to an embodiment, a third protective layer PSV3 is disposed on the first protective layer PSV1 on which the driving electrodes Tx are disposed.

Figure 5I:
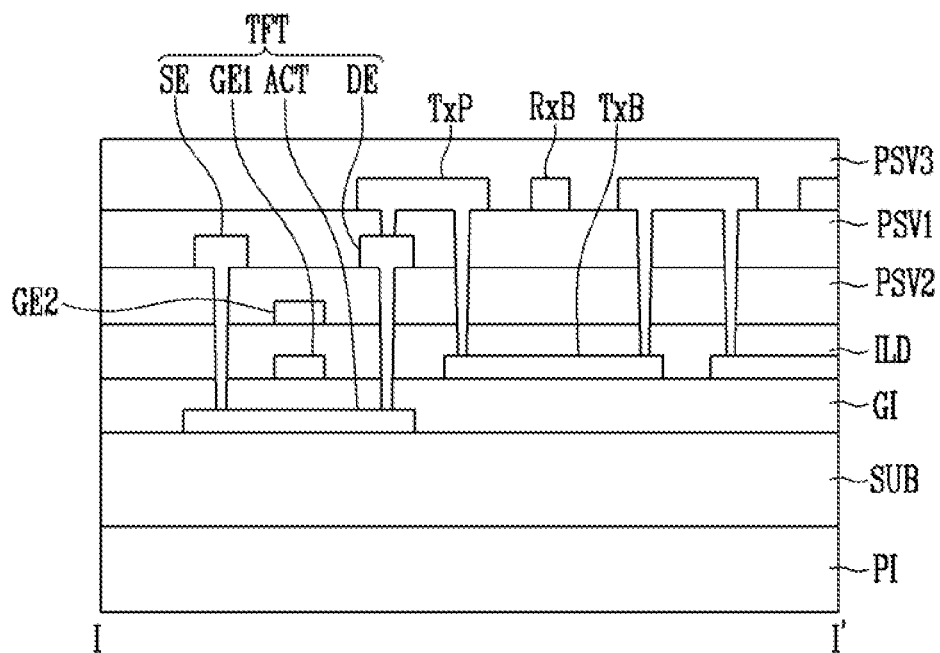
Figure 5J:
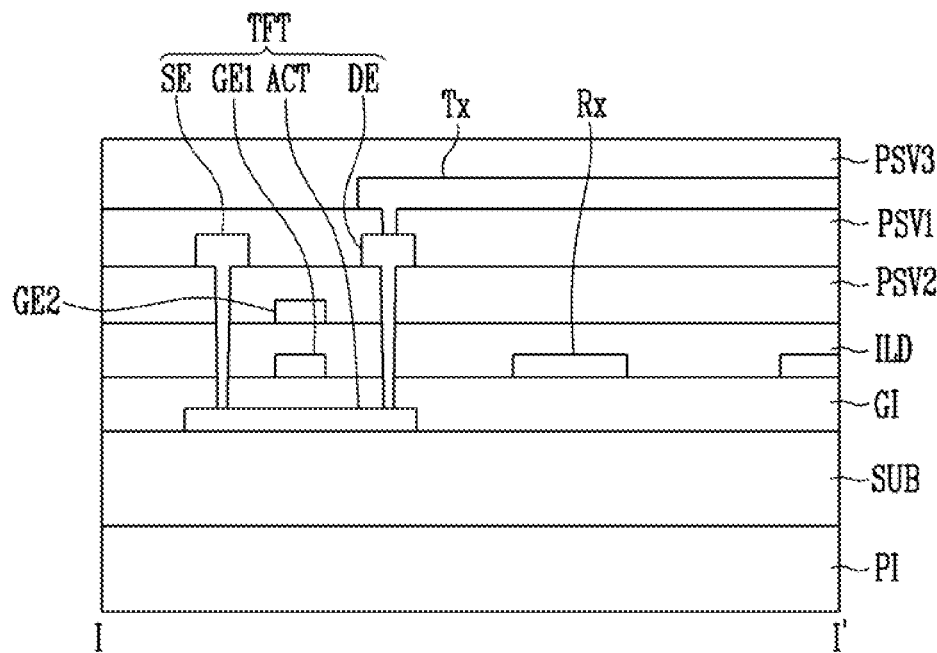

Referring to FIG. 5I, according to an embodiment, an adhesive layer PI is disposed under a substrate SUB, and a thin film transistor TFT is disposed on the substrate SUB. Specifically, a semiconductor layer ACT is disposed on the substrate SUB.

According to an embodiment, a gate insulating layer GI is disposed on the substrate SUB on which the semiconductor layer ACT is disposed. A gate electrode GE1 and a first connection pattern TxB is disposed on the gate insulating layer GI. An interlayer insulating layer ILD is disposed on the gate insulating layer GI on which the gate electrode GE and the first connection pattern TxB are disposed. The gate electrode GE1 and the first connection pattern TxB are formed in the same layer, and are formed of the same material through the same process.

According to an embodiment, an additional electrode GE2 is disposed on the interlayer insulating layer ILD. A second protective layer PSV2 is disposed on the interlayer insulating layer ILD on which the additional electrode GE2 is disposed.

According to an embodiment, a source electrode SE and a drain electrode DE are disposed on the second protective layer PSV2. The source electrode SE and the drain electrode DE are respectively connected to a source region and a drain region of the semiconductor layer ACT through contact holes that penetrate the second protective layer PSV2, the interlayer insulating layer ILD, and the gate insulating layer GI.

According to an embodiment, a first protective layer PSV1 that covers the thin film transistor TFT is provided on the second protective layer PSV2 on which the source electrode SE and the drain electrode DE are provided.

According to an embodiment, driving cells TxP, sensing cells RxP, and a second connection pattern RxB are disposed on the first protective layer PSV1. The driving cell TxP is connected to the drain electrode DE through a contact hole that penetrates the first protective layer PSV1, and is connected to the first connection pattern TxB through a contact hole that penetrates the first and second protective layers PSV1 and PSV2 and the interlayer insulating layer ILD.

According to an embodiment, the driving cells TxP, the sensing cells RxP, and the second connection pattern RxB are formed in the same layer, and are formed of the same material through the same process.

According to an embodiment, a third protective layer PSV3 is disposed on the first protective layer PSV1 on which the driving cells TxP, the sensing cells RxP, and the second connection pattern RxB are disposed.

Referring to FIG. 53, according to an embodiment, an adhesive layer PI is disposed under a substrate SUB, and a thin film transistor TFT is disposed on the substrate SUB. Specifically, a semiconductor layer ACT is disposed on the substrate SUB.

According to an embodiment, a gate insulating layer GI is disposed on the substrate SUB on which the semiconductor layer ACT is disposed. A gate electrode GE1 and sensing electrodes Rx are disposed on the gate insulating layer GI. The gate electrode GE1 and the sensing electrodes Rx are formed in the same layer, and are formed of the same material through the same process.

According to an embodiment, an interlayer insulating layer ILD is disposed on the gate insulating layer GI on which the gate electrode GE1 and the sensing electrodes Rx are disposed.

According to an embodiment, an additional electrode GE2 is disposed on the interlayer insulating layer ILD. A second protective layer PSV2 is disposed on the interlayer insulating layer ILD on which the additional electrode GE2 is disposed.

According to an embodiment, a source electrode SE and a drain electrode DE are disposed on the second protective layer PSV2. The source electrode SE and the drain electrode DE are respectively connected to a source region and a drain region of the semiconductor layer ACT through contact holes that penetrate the second protective layer PSV2, the interlayer insulating layer ILD, and the gate insulating layer GI, respectively.

According to an embodiment, a first protective layer PSV1 that covers the thin film transistor TFT is disposed on the second protective layer PSV2 on which the source electrode SE and the drain electrode DE are disposed.

According to an embodiment, driving electrodes Tx are disposed on the first protective layer PSV1. The driving electrodes Tx are connected to the drain electrode DE through contact holes that penetrate the first protective layer PSV1.

According to an embodiment, a third protective layer PSV3 is disposed on the first protective layer PSV1 on which the driving electrodes Tx are disposed.

Figure 6:
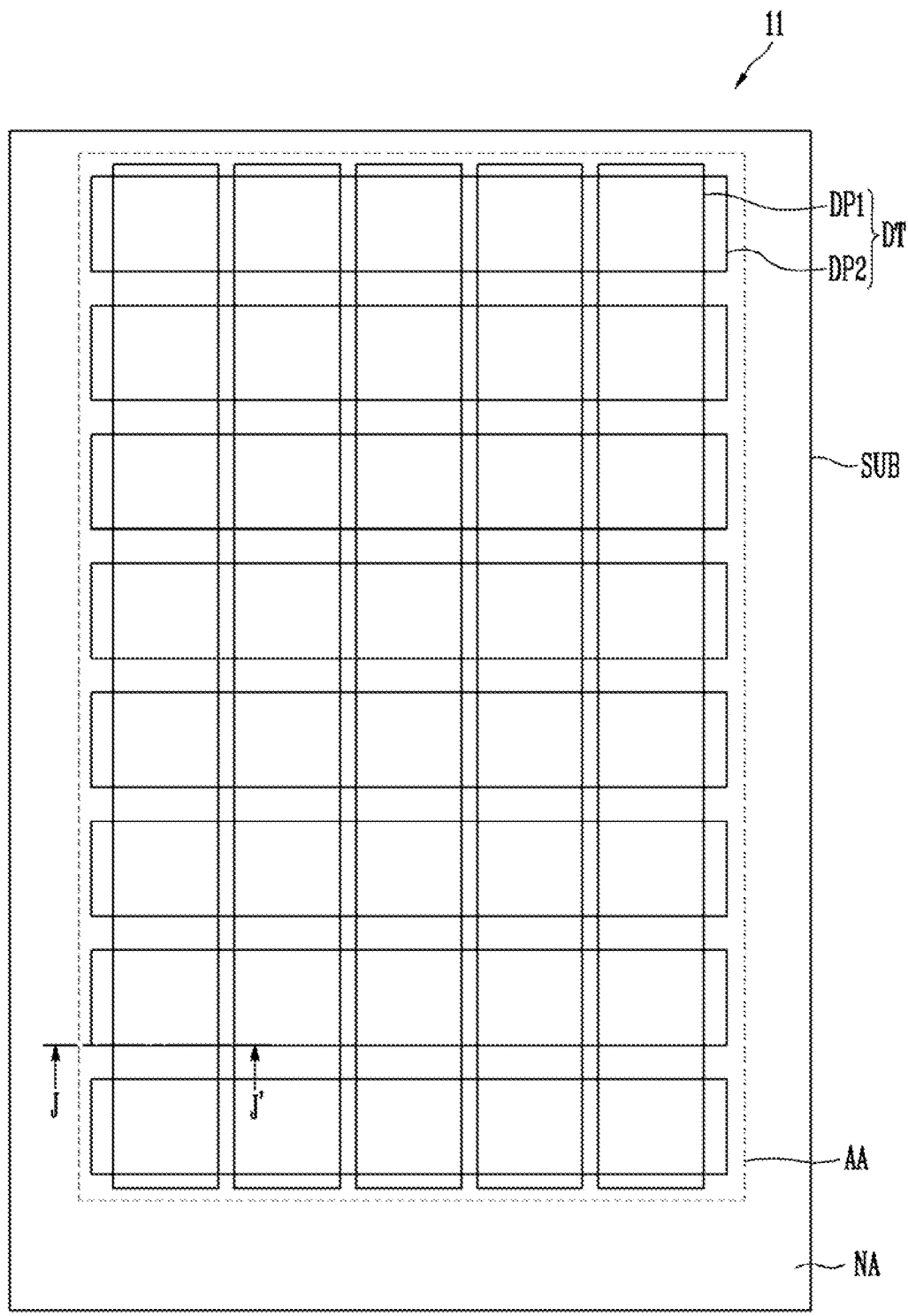
FIG. 6 is a plan view of a digitizer according to an embodiment of the present disclosure.
Figure 7A:
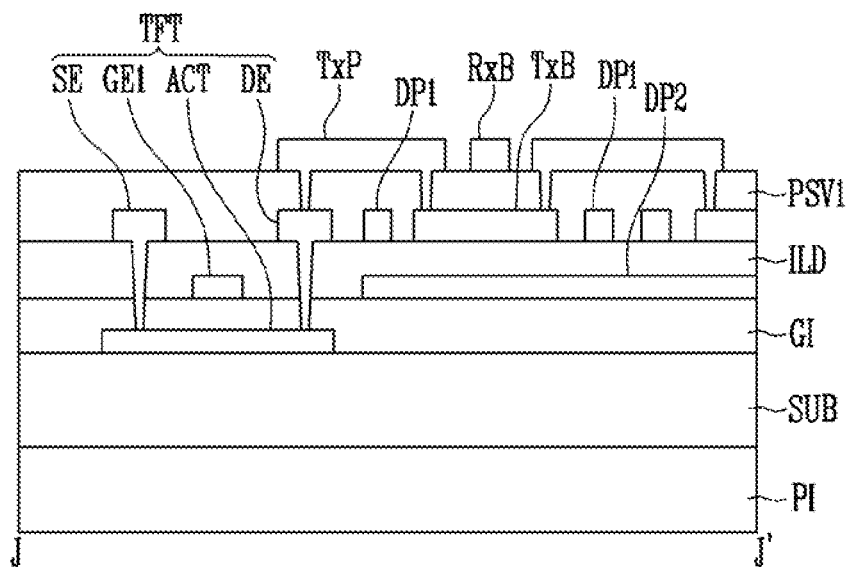
FIGS. 7A and 7B are sectional views taken along line J-J' of FIG. 6.
Figure 7B:
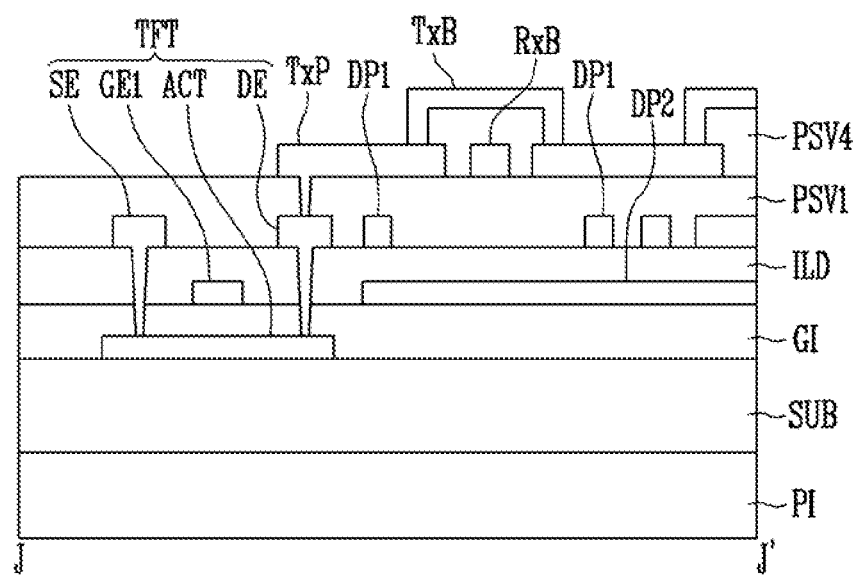

FIG. 6 is a plan view of a digitizer according to an embodiment of the present disclosure. FIGS. 7A and 7B are sectional views taken along line J-J' of FIG. 6.

In FIGS. 6, 7A, and 7B, differences with respect to the above-described embodiments will be mainly described to avoid redundancy. Components not particularly described in FIGS. 6, 7A, and 7B are substantially similar to those of the above-described embodiments. In addition, identical reference numerals refer to identical components, and similar reference numerals refer to similar components.

Referring to FIG. 6, according to an embodiment, a touch sensor 11 of the present disclosure includes a digitizer DT. The digitizer DT senses a user's touch by using first and second digitizer patterns DP1 and DP2.

For example, according to an embodiment, the digitizer DT can be implemented using an electromagnetic resonance (EMR) method. An EMR method uses a digitizer sensor substrate that includes a plurality of coils, and detects a pen's position by reading a signal induced in the coil by a magnetic field of the pen as the user moves the pen.

In FIG. 6, according to an embodiment, the first and second digitizer patterns DP1 and DP2 have a rectangular loop shape. However, embodiments of the present disclosure are not limited thereto, and the first and second digitizer patterns DP1 and DP2 may have various other shapes.

According to an embodiment, the first and second digitizer patterns DP1 and DP2 overlap each other when viewed on a plane.

In some embodiments, the first and second digitizer patterns DP1 and DP2 are made of a metallic material such as copper (Cu), aluminum (Al), molybdenum (Mo), or silver (Ag). However, embodiments of the present disclosure are not limited thereto, and the first and second digitizer patterns DP1 and DP2 may be made of a transparent material.

According to an embodiment, the digitizer DT is integrally incorporated into the touch sensor 11.

According to an embodiment, FIG. 7A shows a sectional structure of the touch sensor 11, which illustrates a stacked structure of the touch sensor 11 that includes the digitizer DT. Hereinafter, the touch sensor 11 of the present disclosure will be described along a stacking order.

According to an embodiment, an adhesive layer PI is disposed under a substrate SUB, and a thin film transistor TFT is disposed on the substrate SUB. Specifically, a semiconductor layer ACT is disposed on the substrate SUB.

According to an embodiment, a gate insulating layer GI is disposed on the substrate SUB on which the semiconductor layer ACT is disposed.

According to an embodiment, a gate electrode GE1 and a second digitizer pattern DP2 are disposed on the gate insulating layer GI. The gate electrode GE1 and the second digitizer pattern DP2 are formed in the same layer, and are formed of the same material through the same process.

According to an embodiment, an interlayer insulating layer ILD is disposed on the gate insulating layer GI on which the gate electrode GE1 and the second digitizer pattern DP2 are disposed.

According to an embodiment, a source electrode SE and a drain electrode DE are disposed on the interlayer insulating layer ILD. The source electrode SE and the drain electrode DE are respectively connected to a source region and a drain region of the semiconductor layer ACT through contact holes that penetrate the interlayer insulating layer ILD and the gate insulating layer GI.

In addition, according to an embodiment, a first digitizer pattern DP1 and a first connection pattern TxB are disposed on the interlayer insulating layer ILD.

According to an embodiment, the source electrode SE, the drain electrode DE, the first digitizer pattern DP1, and the first connection pattern TxB are formed in the same layer, and are formed of the same material through the same process.

According to an embodiment, a first protective layer PSV1 that covers the source electrode SE, the drain electrode DE, the first digitizer pattern DP1, and the first connection pattern TxB is disposed on the interlayer insulating layer ILD.

According to an embodiment, driving cells TxP, sensing cells RxP, and a second connection pattern RxB are disposed on the first protective layer PSV1. The driving cells TxP are connected to the first connection pattern TxB through contact holes that penetrate the first protective layer PSV1.

According to an embodiment, the driving cells TxP, the sensing cells RxP, and the second connection pattern RxB are formed in the same layer, and are formed of the same material through the same process.

In an embodiment of the present disclosure, the thin film transistor TFT includes the semiconductor layer ACT, the gate electrode GE1, the source electrode SE, and the drain electrode DE. A case in which the thin film transistor TFT has a top gate structure is illustrated as a non-limiting example, but embodiments of the present disclosure are not limited thereto. For example, the thin film transistor TFT may have a bottom gate structure.

According to an embodiment, FIG. 7B illustrates a touch sensor having a structure different from that of the touch sensor shown in FIG. 7A. In FIG. 7B, differences with respect to the above-described embodiment will be mainly described to avoid redundancy.

According to an embodiment, an adhesive layer PI is disposed under a substrate SUB, and a thin film transistor TFT is disposed on the substrate SUB. Specifically, a semiconductor layer ACT is disposed on the substrate SUB.

According to an embodiment, a gate insulating layer GI is disposed on the substrate SUB on which the semiconductor layer ACT is disposed.

According to an embodiment, a gate electrode GE1 and a second digitizer pattern DP2 are disposed on the gate insulating layer GI. The gate electrode GE1 and the second digitizer pattern DP2 are formed in the same layer, and are formed of the same material through the same process.

According to an embodiment, an interlayer insulating layer ILD is disposed on the gate insulating layer GI on which the gate electrode GE1 and the second digitizer pattern DP2 are disposed.

According to an embodiment, a source electrode SE and a drain electrode DE are disposed on the interlayer insulating layer ILD. The source electrode SE and the drain electrode DE are respectively connected to a source region and a drain region of the semiconductor layer ACT through contact holes that penetrate the interlayer insulating layer ILD and the gate insulating layer GI.

In addition, according to an embodiment, a first digitizer pattern DP1 is disposed on the interlayer insulating layer ILD.

According to an embodiment, the source electrode SE, the drain electrode DE, and the first digitizer pattern DP1 are formed in the same layer, and are formed of the same material through the same process.

According to an embodiment, a first protective layer PSV1 that covers the source electrode SE, the drain electrode DE, and the first digitizer pattern DP1 is disposed on the interlayer insulating layer ILD.

According to an embodiment, driving cells TxP and second connection pattern RxB are disposed on the first protective layer PSV1. The driving cells TxP and the second connection pattern RxB are formed in the same layer, and are formed of the same material through the same process.

In addition, according to an embodiment, a fourth protective layer PSV4 that covers the driving cells TxP and the second connection pattern RxB is disposed on the first protective layer PSV1.

According to an embodiment, the fourth protective layer PSV4 is an organic insulating layer that includes an organic insulating material. Examples of an organic insulating material include a polyacryl-based compound, a polyimide-based compound, a fluorine-based compound such as Teflon, a benzocyclobutene-based compound, etc. In addition, the fourth protective layer PSV4 is formed in a single layer. However, embodiments of the present disclosure are not limited thereto, and the fourth protective layer PSV4 may have multiple layers.

According to an embodiment, a first connection pattern TxB is disposed on the fourth protective layer PSV4. The first connection pattern TxB connects adjacent driving cells TxP.

In a touch sensor and display device including the same according to a present disclosure, the touch driver and the electrodes for touch sensing in the touch sensor are formed of the same material through the same process.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, or elements described in connection with a particular embodiment may be used singly or in combination with features, characteristics, or elements described in connection with other embodiments unless otherwise specifically indicated. Accordingly, it will be understood by those of skill in the art that various changes in form and details may be made without departing from the spirit and scope of the embodiments of the present disclosure as set forth in the following claims.

What is claimed is:

1. A touch sensor, comprising:
a substrate that includes an active region and a non-active region;
driving cells disposed on the active region that extend in a first direction;
sensing cells disposed on the active region that extend in a second direction that intersects the first direction;
a first connection pattern that connects adjacent driving cells;
a second connection pattern that connects adjacent sensing cells; and
a touch driver disposed on the non-active region, the touch driver including thin film transistors that transmit a driving signal to each of the driving cells,
wherein the thin film transistor includes:
a semiconductor layer;
a gate electrode disposed on the semiconductor layer with a first insulating layer interposed therebetween; and
source and drain electrodes connected to the semiconductor layer, the source and drain electrodes being spaced apart from each other,
wherein the first connection pattern is disposed in the same layer as the gate electrode, and
wherein the sensing cells are disposed in the same layer as and are formed from the same material as the source electrode and the drain electrode.

2. The touch sensor of claim 1, wherein the second connection pattern is disposed in the same layer as and is formed from the same material as the source electrode and the drain electrode.

3. The touch sensor of claim 1, wherein the driving cells are disposed in the same layer as and are formed from the same material as the source electrode and the drain electrode.

4. A touch sensor, comprising:
a substrate that includes an active region and a non-active region;
driving cells disposed on the active region that extend in a first direction;
sensing cells disposed on the active region that extend in a second direction that intersects the first direction;
a first connection pattern that connects adjacent driving cells;
a second connection pattern that connects adjacent sensing cells; and a touch driver disposed on the non-active region, the touch driver including thin film transistors that transmit a driving signal to each of the driving cells, wherein the thin film transistor includes:
a semiconductor layer;
a gate electrode disposed on the semiconductor layer with a first insulating layer interposed therebetween; and
source and drain electrodes connected to the semiconductor layer, the source and drain electrodes being spaced apart from each other,
wherein the first connection pattern is disposed in the same layer as at least one of the source electrode, the drain electrode, or the gate electrode,
wherein the sensing cells are disposed in the same layer as the gate electrode, and
wherein the driving cells are on the same layer as the drain electrode and are directly connected to the drain electrode.

5. The touch sensor of claim 4, wherein the driving cells and the sensing cells are disposed in different layers.

6. A touch sensor, comprising:
a substrate that includes an active region and a non-active region;
driving cells disposed on the active region that extend in a first direction;
sensing cells disposed on the active region that extend in a second direction that intersects the first direction;
a first connection pattern that connects adjacent driving cells;
a second connection pattern that connects adjacent sensing cells; and
a touch driver disposed on the non-active region, the touch driver including thin film transistors that transmit a driving signal to each of the driving cells, wherein the thin film transistor includes:
a semiconductor layer;
a gate electrode disposed on the semiconductor layer with a first insulating layer interposed therebetween; and
source and drain electrodes connected to the semiconductor layer, the source and drain electrodes being spaced apart from each other,
a second insulating layer disposed over the gate electrode; and
an additional electrode disposed on the second insulating layer, the additional electrode forming a capacitor together with the gate electrode,
wherein the first connection pattern is disposed directly on the same layer as the additional electrode.

7. The touch sensor of claim 6, wherein the second connection pattern is disposed in the same layer as and is formed from the same material as the source electrode and the drain electrode.

8. The touch sensor of claim 6, wherein the driving cells are disposed in the same layer as and are formed from the same material as the source electrode and the drain electrode.

9. A display device, comprising:
a display panel that displays an image; and
a touch sensor disposed on the display panel that senses a touch, wherein the touch sensor includes:
a substrate that includes an active region and a non-active region;
driving cells disposed on the active region that extend in a first direction;
sensing cells disposed on the active region that extend in a second direction that intersects the first direction;
a touch driver disposed on the non-active region that includes thin film transistors that transmit a driving signal to each of the driving cells; and
a digitizer disposed on the substrate that includes first and second digitizer patterns,
wherein each of the first and second digitizer patterns has a closed loop shape.

10. The display device of claim 9, wherein
the touch sensor further includes a first connection pattern that connects the driving cells and a second connection pattern that connects the sensing cells, and
the thin film transistor includes a semiconductor layer, a gate electrode disposed on the semiconductor layer with a first insulating layer interposed therebetween, and source and drain electrodes connected to the semiconductor layer, the source and drain electrodes being spaced apart from each other.

11. The display device of claim 10, wherein the first digitizer pattern is disposed in the same layer as the source electrode and the drain electrode.

12. The display device of claim 10, wherein the first digitizer pattern is disposed in the same layer as the first connection pattern.

13. The display device of claim 10, wherein the second digitizer pattern is disposed in the same layer as the gate electrode.

* * * * *